(12) United States Patent
Knoedgen et al.

(10) Patent No.: US 9,531,260 B2
(45) Date of Patent: Dec. 27, 2016

(54) VOLTAGE DOUBLER AND VOLTAGE DOUBLING METHOD FOR USE IN PWM MODE

(71) Applicant: Dialog Semiconductor (UK) Limited, Reading (GB)

(72) Inventors: Horst Knoedgen, Munich (DE); Gary Hague, Swindon (GB)

(73) Assignee: Dialog Semiconductor (UK) Limited, Reading (GB)

( * ) Notice: Subject to any disclaimer, the term of this patent is extended or adjusted under 35 U.S.C. 154(b) by 0 days.

(21) Appl. No.: 14/864,975

(22) Filed: Sep. 25, 2015

(65) Prior Publication Data

US 2016/0181914 A1 Jun. 23, 2016

(30) Foreign Application Priority Data

Dec. 19, 2014 (DE) ........................ 10 2014 226 716

(51) Int. Cl.
*H02M 3/18* (2006.01)
*H02M 3/07* (2006.01)
(Continued)

(52) U.S. Cl.
CPC ................. *H02M 3/07* (2013.01); *H02M 1/08* (2013.01); *H02P 1/18* (2013.01); *H02P 7/00* (2013.01); *H03K 7/08* (2013.01)

(58) Field of Classification Search
CPC ............ H02M 3/18; H02M 3/07; H02M 1/08; H02P 1/18; H02P 7/00; H02K 7/08
(Continued)

(56) References Cited

U.S. PATENT DOCUMENTS

| 4,276,588 A | * | 6/1981 | McLyman | ............ | H02H 7/1213 |
| | | | | | 363/24 |
| 4,533,986 A | * | 8/1985 | Jones | .................. | H02M 1/4208 |
| | | | | | 323/222 |

(Continued)

FOREIGN PATENT DOCUMENTS

DE 10 2013 008 586 5/2013

OTHER PUBLICATIONS

German Search Report 10 2014 226 716.1 and English translation, Jul. 20, 2015, Dialog Semiconductor (UK) Limited.
(Continued)

*Primary Examiner* — Rita Leykin
(74) *Attorney, Agent, or Firm* — Saile Ackerman LLC; Stephen B. Ackerman

(57) ABSTRACT

An apparatus and a method for generating a pulse width modulated, PWM, voltage doubler signal is presented The apparatus comprises a voltage source, a capacitor, an output node, a switchable circuit assembly for connecting the voltage source, the capacitor and the output node, and a controller for the switchable circuit assembly which is adapted to be switchable between a first circuit configuration in which the capacitor is connected in parallel to the voltage source so as to be chargeable by the voltage source, and a second circuit configuration in which the capacitor is connected in series between the voltage source and the output node, and wherein the control means is adapted to control the switchable circuit assembly to switch to the first circuit configuration in the first period, and to switch to the second circuit configuration in the second period.

23 Claims, 3 Drawing Sheets

(51) Int. Cl.
*H02P 7/00* (2016.01)
*H02P 1/18* (2006.01)
*H02M 1/08* (2006.01)
*H03K 7/08* (2006.01)

(58) Field of Classification Search
USPC . 318/504, 599; 363/41, 49, 59, 60; 323/220, 323/238
See application file for complete search history.

(56) References Cited

U.S. PATENT DOCUMENTS

| | | | | |
|---|---|---|---|---|
| 5,408,403 A * | 4/1995 | Nerone | H02M 1/425 | 315/247 |
| 5,448,137 A * | 9/1995 | Bobel | H05B 41/28 | 315/200 R |
| 5,463,284 A * | 10/1995 | Mattas | H05B 41/2828 | 315/227 R |
| 5,479,172 A * | 12/1995 | Smith | G01S 13/758 | 342/51 |
| 5,488,269 A * | 1/1996 | El-Hamamsy | H02M 1/4241 | 315/209 R |
| 5,631,523 A * | 5/1997 | Rothenbuhler | H05B 41/046 | 315/103 |
| 5,680,300 A * | 10/1997 | Szepesi | H02M 3/07 | 363/59 |
| 5,712,536 A * | 1/1998 | Haas | H05B 41/28 | 315/209 R |
| 5,841,646 A * | 11/1998 | Cornec | H02M 7/53803 | 219/665 |
| 6,043,633 A * | 3/2000 | Lev | H02M 1/4225 | 323/222 |
| 6,172,882 B1 * | 1/2001 | Tanaka | H02M 7/5387 | 363/132 |
| 6,359,797 B1 * | 3/2002 | Bayer | H02M 3/07 | 307/110 |
| 6,583,999 B1 * | 6/2003 | Spindler | H02M 3/337 | 363/132 |
| 7,236,376 B2 * | 6/2007 | Yang | H02M 3/33523 | 363/21.04 |
| 7,369,421 B1 * | 5/2008 | Chan | H02M 7/5387 | 363/132 |
| 7,683,595 B2 * | 3/2010 | Feldtkeller | G05F 1/70 | 323/282 |
| 7,792,166 B2 * | 9/2010 | Borschowa | H01S 5/0683 | 323/283 |
| 8,008,899 B2 * | 8/2011 | Heim | H02M 3/1582 | 323/222 |
| 8,462,256 B2 * | 6/2013 | Nagaoka | G02B 7/021 | 348/335 |
| 8,618,778 B2 * | 12/2013 | Gray | H02M 7/537 | 323/220 |
| 8,638,010 B2 * | 1/2014 | Ly | H02J 7/345 | 307/109 |
| 8,766,608 B2 * | 7/2014 | Yamazaki | H01L 27/1225 | 257/72 |
| 8,855,336 B2 * | 10/2014 | Sun | G05F 1/46 | 330/285 |
| 9,391,520 B2 * | 7/2016 | Saby | H02M 3/1588 | |
| 2009/0086511 A1 | 4/2009 | Lin | | |

OTHER PUBLICATIONS

"A Switched-Capacitor Inverter Using Series/Parallel Conversion With Inductive Load," by Youhei Hinago et al., IEEE Transactions on Industrial Electronics, vol. 59, No. 2, Feb. 2012, pp. 878-887.

"A Single-Phase Multilevel Inverter Using Switched Series/Parallel DC Voltage Sources," by Youhei Hinago et al., IEEE Transactions on Industrial Electronics, vol. 57, No. 8, Aug. 2010, pp. 2643-2650.

* cited by examiner

VOLTAGE DOUBLER AND VOLTAGE DOUBLING METHOD FOR USE IN PWM MODE

TECHNICAL FIELD

This application relates to an apparatus and a method for generating a pulse-width modulated (PWM) signal having a pulse height greater than an available source voltage. The method and apparatus are particularly applicable to powering inertial loads in PWM mode, such as electric motors. The method and apparatus are further particularly applicable to powering inertial loads in PWM mode in portable or mobile devices, such as smartphones, tablet computers, PDAs, or the like.

BACKGROUND

Methods and apparatus for powering electric devices in PWM mode are known in the art. For some such electric devices, such as electric motors, a higher voltage may be required for initial operation (start-up) than for normal operation. For instance, a higher voltage may be required for starting an electric motor, than for driving the motor under stable conditions.

SUMMARY

There is a need for an apparatus for generating a PWM signal having a pulse height greater than an available source voltage that has a reduced number of components and has a simpler configuration than prior art voltage doublers, and for a corresponding method for generating a PWM signal having a pulse height greater than an available source voltage. There is further need for such an apparatus and method adapted for powering an inertial load, such as a motor. In view of these needs, the present invention provides an apparatus for generating a PWM signal having a pulse height greater than an available source voltage that comprises a single capacitor only, and a corresponding method for generating a PWM signal, in particular for driving an electric motor.

An aspect of the present disclosure relates to an apparatus for generating a PWM signal with a first period of time (first phase) and a second period of time (second phase), wherein said PWM signal has a PWM pulse conveying significant power/energy during the second period and does not have the PWM pulse during the first period, i.e. the PWM signal is approximately zero during the first period. The pulse may be a rectangular pulse, but is not limited thereto. The apparatus comprises a voltage source, a (flying) capacitor, an output node for outputting the PWM signal, a switchable circuit assembly for (switchably) connecting the voltage source, the capacitor and the output node, and control means for controlling switching of the switchable circuit assembly. The switchable circuit assembly may be adapted to be switchable between a first circuit configuration in which the capacitor is connected in parallel to the voltage source so as to be chargeable by the voltage source, and a second circuit configuration in which the capacitor is connected in series between the voltage source and the output node such that polarities of the voltage source and the capacitor are aligned with each other. Here, alignment of polarities is understood to indicate that if e.g. the positive terminal of the voltage source is arranged on a downstream side of the voltage source along the series connection, the positive terminal (positive node) of the capacitor is arranged on the downstream side of the capacitor along the series connection. In other words, in the second circuit configuration the capacitor is connected in series between the voltage source and the output node such that the voltage output by the voltage source and the voltage across the capacitor add up constructively. The control means may be adapted to control the switchable circuit assembly to switch to the first circuit configuration in the first period of the PWM signal, and to switch to the second circuit configuration in the second period. In other words, the control means may be adapted to control switching of the switchable circuit assembly such that the capacitor is charged by the voltage source during the first period and a combined voltage of the voltage source and the capacitor is applied to the output node during the second period. It is further understood that the PWM signal is generated in accordance with PWM control. Accordingly, the durations of the first and second periods are determined e.g. by a duty cycle and a frequency of the PWM signal that is to be generated.

Configured as above, the apparatus is capable of applying a voltage that is substantially twice as large as the available output voltage of the voltage source to the output node during the pulses of the PWM signal. As the present inventor has realized, the fact that the charge that can be drawn from the capacitor during the second period after charging of the capacitor during the first period may be limited does not impair overall performance when generating a pulsed signal instead of a continuous signal. Only a single capacitor is required to achieve this doubling of the available output voltage of the voltage source, and the apparatus further does not need to comprise any inductances. Accordingly, the apparatus achieves efficient boosting of the available output voltage, can be made more compact, and is less expensive to manufacture. For the above reasons, the apparatus represents an optimum choice for use in mobile or portable devices, which require miniaturization of components and in which an available output voltage is limited by the capabilities of a battery.

In embodiments, the switchable circuit assembly may comprise a first circuit branch that is switchable and connects the voltage source to a first node of the capacitor, a second circuit branch that is switchable and connects the second node of the capacitor to ground, and a third circuit branch that is switchable and connects the second node of the capacitor to the voltage source. The first circuit branch may comprise first switching means for switching between a conducting state and a non-conducting state of the first circuit branch. The second circuit branch may comprise second switching means for switching between a conducting state and a non-conducting state of the second circuit branch. The third circuit branch may comprise third switching means for switching between a conducting state and a non-conducting state of the third circuit branch. The third circuit branch may be connected to the second circuit branch at a node between the second node of the capacitor and the second switching means. The output node may be connected to the first node of the capacitor. The first circuit configuration may be a circuit configuration in which the first and second circuit branches are in the conducting state and the third circuit branch is in the non-conducting state, e.g. a circuit configuration in which the first and second switching means are closed and the third switching means is open. The second circuit configuration may be a circuit configuration in which the first and second circuit branches are in the non-conducting state and the third circuit branch is in the conducting state, e.g. a circuit configuration in which the first and second switching means are open and the third switching means is closed.

Configured as above, switching between the first and second circuit configurations is achieved by a simple switching operation, using a particularly simple switchable circuit assembly.

In embodiments, the apparatus may comprise current limiting means for limiting the current by which the capacitor is charged when the switchable circuit assembly is switched to the first circuit configuration, i.e. when the capacitor is connected to the voltage source in parallel and is charged by the voltage source. The current limiting means may be provided in the first circuit branch and/or in the second circuit branch. The current limiting means may be a current source, e.g. implemented as a classical current source. Alternatively, the current limiting means may be implemented as a resistor, a transistor, a current mirror, or a DC converter.

By providing the current limiting means, current spikes during charging the capacitor can be avoided, and the charging current is smoothed. Thereby, overall system stability can be improved.

In embodiments, the apparatus may further comprise a fourth circuit branch connecting the first node of the capacitor to the output node. The fourth circuit branch may be switchable between a conducting state and a non-conducting state of the fourth circuit branch. To this end, the fourth circuit branch may comprise fourth switching means for switching the fourth circuit branch between the conducting state and the non-conducting state. In the first circuit configuration, the fourth circuit branch may be in the non-conducting state and in the second circuit configuration the fourth circuit branch may be in the conducting state. For instance, in the first circuit configuration the fourth switching means may be open and in the second circuit configuration the fourth switching means may be closed.

In embodiments, the switchable circuit assembly may be further switchable to a third circuit configuration in which the output node is connected (directly) to the terminal of the voltage source such that the voltage output by the voltage source is applied to the output node. The control means may be adapted to control the switchable circuit assembly to switch between the second circuit configuration and the third circuit configuration during the second period.

By switching, on the fly, between the second and third circuit configurations during the second period, a stepwise shape of the generated PWM pulse can be generated, and the stepwise shape of the pulse can be particularly adapted to e.g. requirements of the electric load that is to be driven by the PWM signal. Further, the amount of power that is delivered to the electric load connected to the output node can be fine-tuned and electromagnetic interference can be reduced.

In embodiments, the switchable circuit assembly may further be switchable to the third circuit configuration in which the output node is connected (directly) to the terminal of the voltage source such that the voltage output by the voltage source is applied to the output node, and to a fourth circuit configuration in which the output node is not connected to the terminal of the voltage source, i.e. in which the apparatus does not apply a voltage to the output node. The control means may be adapted to operate in a first operating mode in which the control means controls the switchable circuit assembly to switch between the first circuit configuration in the first period and the second circuit configuration in the second period, and in a second operating mode in which the control means controls the switchable circuit assembly to switch between the fourth circuit configuration in the first period and the third circuit configuration in the second period. The control means may be adapted to operate in the first operating mode if a required drive voltage exceeds the output voltage of the voltage source, and to operate in the second operating mode if the required drive voltage does not exceed the output voltage of the voltage source.

In the above configuration, the second operating mode corresponds to conventional PWM mode operation without voltage boosting. Thus, the apparatus described above is switchable, on the fly, between conventional PWM mode and a voltage boost mode, in accordance with requirements of the external electric load to be driven by the PWM signal. For instance, if a higher voltage is required for start-up of an electric motor for overcoming inertia of the rotor of the electric motor, the apparatus may operate in the voltage boost mode. On the other hand, once the electric motor has been accelerated to run at a constant speed, the apparatus may operate in conventional PWM mode.

In embodiments, the first circuit branch may further comprise a first Zener diode is connected in parallel to the first switching means, and the third circuit branch may further comprise a second Zener diode connected in parallel to the third switching means.

Providing the Zener diodes allow for a higher voltage across the electric load that is connected to the output node. Thereby, the time for discharging the electric load that is connected to the output node can be reduced. For instance, the electric load may be an electric motor, in which case the above configuration allows extending a time window for measuring the electromotive force of the electric motor after stopping power supply to the electric motor.

As will be described below, the apparatus according to the above aspect can be advantageously applied to driving an electric motor and to assisting measurement of the electromotive force of the electric motor. The electric motor may be driven by a bridge circuit or a half bridge circuit that receives power from the output node.

Accordingly, in embodiments the apparatus may be adapted to supply electric power to an electric motor connectable to the output node. The switchable circuit assembly may be further adapted to be switchable to a fifth circuit configuration in which the first node of the capacitor is connected to the output node, and the second node of the capacitor is connected to ground. The control means may be adapted to control the switchable circuit assembly to switch to the fifth circuit configuration after power supply to the motor has been stopped. The fifth circuit configuration may further be a circuit configuration in which the output node is connected to the terminal of the voltage source through a resistance.

Switching the switchable circuit assembly to the fifth circuit configuration e.g. in during measurement of the electromotive force of the electric motor causes the flying capacitor to be connected between the high-potential terminal of the electric motor and ground. Accordingly, the electric motor has low noise supply and any capacitive coupling will not pose a problem for the measurement. Moreover, connecting the high-potential terminal of the electric motor to the voltage source during the measurement of the electromotive force of the electric motor allows maintaining the voltage at said terminal of the electric motor at the (filtered) supply voltage.

Another aspect of the present disclosure relates to a method of generating a pulse width modulated, PWM, signal with a first period of time (first phase) and a second period of time (second phase), wherein said PWM signal has a PWM pulse during the second period and does not have the PWM pulse during the first period. The method may be operated by means of an apparatus comprising: a voltage source, a capacitor, an output node for outputting the PWM signal, and a switchable circuit assembly for (switchably) connecting the voltage source, the capacitor and the output node. The switchable circuit assembly may adapted to be switchable between a first circuit configuration in which the capacitor is connected in parallel to the voltage source so as to be chargeable by the voltage source, and a second circuit configuration in which the capacitor is connected in series between the voltage source and the output node such that polarities of the voltage source and the capacitor are aligned with each other, i.e. such that the voltage output by the voltage source and the voltage across the capacitor add up constructively. In other words, the switchable circuit assembly may be switchable such that the capacitor is charged by the voltage source during the first period and a combined voltage of the voltage source and the capacitor is applied to the output node during the second period. The pulse may be a rectangular pulse, but is not limited thereto. The method may comprise switching the switchable circuit assembly to the first circuit configuration during the first period, and switching the switchable circuit assembly to the second circuit configuration during the second period.

In embodiments, the switchable circuit assembly may comprise a first circuit branch that is switchable and connects the voltage source to a first node of the capacitor, a second circuit branch that is switchable and connects the second node of the capacitor to ground, and a third circuit branch that is switchable and connects the second node of the capacitor to the terminal of the voltage source. The first circuit branch may comprise first switching means for switching between a conducting state and a non-conducting state of the first circuit branch. The second circuit branch may comprise second switching means for switching between a conducting state and a non-conducting state of the second circuit branch. The third circuit branch may comprise third switching means for switching between a conducting state and a non-conducting state of the third circuit branch. The third circuit branch may be connected to the second circuit branch at a node between the second node of the capacitor and the second switching means. The output node may be connected to the first node of the capacitor. The method may comprise switching the first and second circuit branches to the conducting state and switching the third circuit branch to the non-conducting state during the first period, e.g. closing the first and second switching means and opening the third switching means, thereby switching the switchable circuit assembly to the first circuit configuration. The method may further comprise switching the first and second circuit branches to the non-conducting state and switching the third circuit branch to the conducting state during the second period, e.g. opening the first and second switching means and closing the third switching means, thereby switching the switchable circuit assembly to the second circuit configuration.

In embodiments, the method may further comprise limiting the current by which the capacitor is charged when the switchable circuit assembly is switched to the first circuit configuration, i.e. when the capacitor is connected to the voltage source in parallel and is charged by the voltage source. The method may comprise controlling the current output by a current source that is arranged in the first circuit branch and/or in the second circuit branch.

In embodiments, the switchable circuit assembly may further comprise a fourth circuit branch that is switchable and connects the first node of the capacitor to the output node. The fourth circuit branch may be switchable between a conducting state and a non-conducting state of the fourth circuit branch. To this end, the fourth circuit branch may comprise fourth switching means for switching the fourth circuit branch between the conducting state and the non-conducting state. For this configuration, the method may further comprise switching the fourth circuit branch to the non-conducting state during the first period of time, and switching the fourth circuit branch to the conducting state during the second period of time. For instance, the method may comprise opening the fourth switching means during the first period of time, and closing the fourth switching means during the second period of time.

In embodiments, the switchable circuit assembly may further be switchable to a third circuit configuration in which the output node is connected (directly) to the terminal of the voltage source such that the voltage output by the voltage source is applied to the output node. For this configuration, the method may further comprise switching the switchable circuit assembly between the second circuit configuration and the third circuit configuration during the second period.

In embodiments, the switchable circuit assembly may further be switchable to a third circuit configuration in which the output node is connected (directly) to the terminal of the voltage source such that the voltage output by the voltage source is applied to the output node, and to a fourth circuit configuration in which the output node is not connected to the terminal of the voltage source. For this configuration, the method may further comprise switching the switchable circuit assembly to the fourth circuit configuration in the first period, and switching the switchable circuit assembly to the third circuit configuration in the second period.

In embodiments, the method may further comprise supplying the generated PWM signal to a motor connected to the output node.

In embodiments, the switchable circuit assembly is may further be adapted to be switchable to a fifth circuit configuration in which the first node of the capacitor is connected to the output node and the second node of the capacitor is connected to ground. For this configuration, the method may further comprise stopping power supply to the motor, and switching the switchable circuit assembly to the fifth circuit configuration after power supply to the motor has been stopped.

In embodiments, the fifth circuit configuration may be a circuit configuration in which the output node is further connected to the terminal of the voltage source through a resistance.

It will be appreciated that the method steps and apparatus features may be interchanged in many ways. In particular, the details of the disclosed apparatus can be implemented as a method, and the disclosed method steps implemented as apparatus features, as the skilled person will appreciate. Any statements made with respect to the above method steps are understood to also relate to corresponding apparatus features, and vice versa, to the extent that they are applicable.

BRIEF DESCRIPTION OF THE DRAWINGS

The invention is explained below in an exemplary manner with reference to the accompanying drawings, wherein FIGS. 1A and 1B schematically illustrate examples of an apparatus according to embodiments of the invention.

DESCRIPTION

It should be noted that the methods and apparatus including its preferred embodiments as outlined in the present disclosure may be used stand-alone or in combination with the other methods and apparatus disclosed in this document. Furthermore, all aspects of the methods and apparatus outlined in the present disclosure may be arbitrarily combined. In particular, the features of the claims may be combined with one another in an arbitrary manner. Further, if not explicitly indicated otherwise, embodiments can be freely combined with each other.

Figure 1A:
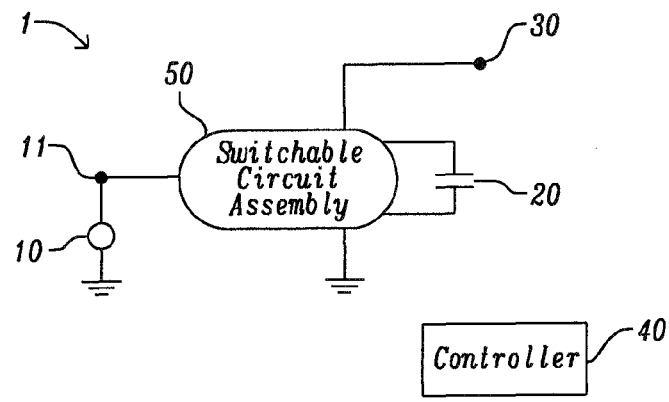

FIG. 1A schematically illustrates an example of an apparatus 1 for generating a PWM signal according to embodiments of the invention. The apparatus 1 comprises a voltage source 10 with a terminal 11, a (flying) capacitor 20, an output node 30 for outputting a PWM signal, a switchable circuit assembly 50 for (switchably) connecting the voltage source 10, the capacitor 20 and the output node 30, and control means (controller) 40 for controlling switching of the switchable circuit assembly 50. The voltage source 10 may be e.g. a battery. The size (capacitance) of the capacitor 20 may be selected in accordance with a periodicity and duty cycle of the PWM signal to be generated, and further in accordance with considerations relating to cost and footprint (area).

The switchable circuit assembly 50 is switchable between a plurality of circuit configurations, under control of the control means 40. To this end, although not shown in the figure for reasons of conciseness, the control means 40 is connected to the switchable circuit assembly 50 such that the control means 40 may send switching commands to the switchable circuit assembly 50. The switchable circuit assembly 50 is at least switchable between a first circuit configuration and a second circuit configuration. In the first circuit configuration, the capacitor 20 is connected in parallel to the voltage source 10, such that the capacitor 20 may be charged by the voltage source 10. In the second circuit configuration, the capacitor 20 is connected in series between the voltage source 10 and the output node 30 such that the polarity of the voltage source 10 and the polarity of the capacitor 20 (after charging by the voltage source 10 when the switchable circuit assembly 50 is in the first circuit configuration) are aligned. In other words, the voltage output by the voltage source 10 and the voltage across the capacitor 20 add up constructively when the switchable circuit assembly 50 is in the second circuit configuration so that the voltage at the output node 30 is larger (in magnitude) than the output voltage $V_O$ of the voltage source 10.

The PWM signal to be output at the output node 30 has a first period of time (a first phase) and a second period of time (a second phase), wherein the second period is defined as a period (phase) in which a PWM pulse is present, and the first period (phase) is defined as a period in which the PWM pulse is not present. The PWM signal is formed by an alternating sequence of first periods and second periods, i.e. by an alternating sequence of pulses and pauses between pulses. It is understood that the PWM signal is generated in accordance with PWM control, so that the respective durations of the first and second periods are determined e.g. by a frequency and a duty cycle of the PWM signal that is to be generated under the PWM control.

The control means 40 is adapted to control the switchable circuit assembly 50 to switch to the first circuit assembly in the first period, more precisely at the beginning of the first period, and to the second circuit configuration in the second period, more precisely at the beginning of the second period. Accordingly, during the first period the capacitor 20 is charged by the voltage source 10. During the second period, the voltage across the capacitor 20 and the voltage output by the voltage source 10 add up at the output node 30. It is understood that in the first circuit configuration of the switchable circuit assembly 50, i.e. during the first period, the output node 30 may be electrically disconnected from the capacitor 20 and the voltage source 10.

It is understood that a corresponding method for generating a PWM signal by means of the apparatus 1 comprises the steps of switching the switchable circuit assembly 50 to the first circuit configuration in the first period, and switching the switchable circuit assembly 50 to the second circuit configuration in the second period. Initially, before starting generation of the PWM signal, the switchable circuit assembly 50 may be kept in the first circuit configuration until the capacitor 20 is fully charged, i.e. for pre-charging the capacitor 20.

Configured as described above, the apparatus 1 and the corresponding method are capable of generating a PWM signal with pulses the height of which is larger than, in particular substantially twice as large as the output voltage $V_O$ of the voltage source 10. Only a single capacitor 20 is required to achieve this purpose.

The switchable circuit assembly 50 may be further adapted to be switchable to a third circuit configuration, in which the output node 30 is connected directly to the terminal 11 of the voltage source 10, i.e. in which the output node 30 is connected to the terminal 11 of the voltage source 10 in such a manner that the output voltage $V_O$ of the voltage source 10 is applied to the output node 30. The control means 40 may be adapted to control the switchable circuit assembly 50 to switch between the second circuit configuration and the third circuit configuration during the second period of time. For instance, the switchable circuit assembly 50 may be switched first to the second circuit configuration at the beginning of the second period and subsequently to the third circuit configuration, or may be switched to the third circuit configuration at the beginning of the second period and subsequently to the second circuit configuration. It is to be understood that the number of switches between the second and third circuit configurations during the second period may be one, as described above, or may be larger than one. Further details on the switching between the second and third circuit configurations during the second period will be provided below in connection with the description of FIG. 3.

When the switchable circuit assembly 50 is in the second circuit configuration, the voltage at the output node 30 is substantially twice the output voltage $V_O$ of the voltage source 10, provided the capacitor 20 is fully charged during the preceding first period. When the switchable circuit assembly 50 is in the third circuit configuration, the voltage at the output node 30 is substantially equal to the output voltage $V_O$ of the voltage source 10. Thus, by controlling the switchable circuit assembly 50 to switch between the second circuit configuration and the third circuit configuration, the pulse height during the second period can be (discretely)

varied to be either the output voltage $V_O$ of the voltage source 10, or substantially twice the output voltage $V_O$ of the voltage source 10.

The corresponding method for generating a PWM signal by means of the apparatus 1 may comprise the steps of controlling the switchable circuit assembly 50 to switch between the second circuit configuration and the third circuit configuration in the second period.

Yet further, the switchable circuit assembly may be adapted to be switchable to a fourth circuit configuration in which the output node 30 is disconnected from the voltage source 10 and disconnected from the capacitor 20, so that no voltage is applied to the output node 30 by the apparatus 1. In the fourth circuit configuration, also the capacitor 20 may be disconnected from the voltage source 10. The control means 40 may be adapted to control the switchable circuit assembly 50 to switch to the fourth circuit configuration in the first period and to the third circuit configuration in the second period. Accordingly, the voltage at the output node 30 switches between substantially zero during the first period and a voltage substantially corresponding to the output voltage $V_O$ of the voltage source 10.

Thus, the apparatus 1 (i.e. the control means 40) may have two operating modes. A first operating mode in which the apparatus 1 acts as a voltage booster (charge pump), and a second operating mode in which the apparatus 1 outputs a PWM signal in accordance with the available output voltage $V_O$ of the voltage source 10. In the first operating mode, the control means 40 controls the switchable circuit assembly 50 to switch to the first circuit configuration in the first period and to the second circuit configuration in the second period, as described above. Optionally, the control means 40 may control the switchable circuit assembly 50 to switch between the second circuit configuration and the third circuit configuration during the second period in order to vary the pulse height. On the other hand, in the second operating mode the control means 40 controls the switchable circuit assembly 50 to switch to the fourth circuit configuration in the first period and to the third circuit configuration in the second period, as described above. It is to be noted that the second operating mode corresponds to the conventional PWM mode without voltage boosting. Thus, the apparatus 1 is switchable on the fly between the conventional PWM mode and a voltage boost mode, in accordance with requirements of the external electric load to be driven by the PWM signal.

A specific implementation of the switchable circuit assembly 50 and the first to fourth circuit configurations will now be described with reference to FIG. 1B.

Figure 1B:
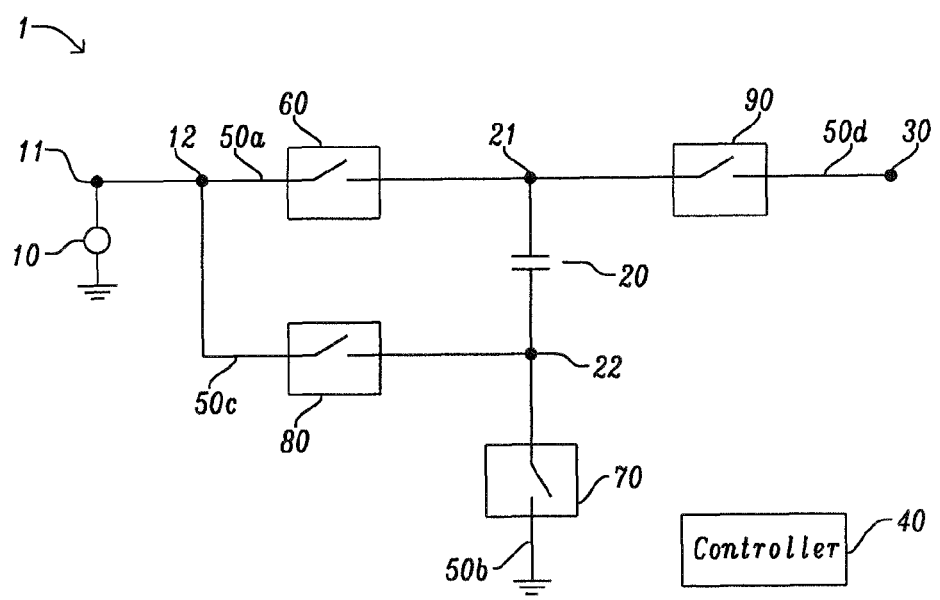

FIG. 1B schematically illustrates another example of an apparatus 1 for generating a PWM signal according to embodiments of the invention. Unless indicated otherwise, the elements illustrated in FIG. 1B are identical to the respective like-numbered elements illustrated in and described with reference to FIG. 1A. The apparatus 1 comprises the voltage source 10 with the terminal 11, the capacitor 20, and the output node 30. In the configuration of FIG. 1B, the switchable circuit assembly 50 is exemplarily embodied by first circuit branch 50a, a second circuit branch 50b, a third circuit branch 50c, and optionally a fourth circuit branch 50d. The first circuit branch 50a (switchably) connects the terminal 11 of the voltage source 10 to a first node (first terminal) 21 of the capacitor 20. The second circuit branch 50b (switchably) connects the second node (second terminal) 22 of the capacitor 20 to ground. The third circuit branch 50c (switchably) connects the second node 22 of the capacitor to the terminal 11 of the voltage source 10. The fourth circuit branch 50d connects the first node 21 of the capacitor 20 to the output node 30. In the absence of the fourth circuit branch 50d, the output node 30 may coincide with the first node 21 of the capacitor 20. In the above and throughout the present disclosure, respective connections are understood to be electric connections.

The first to third circuit branches 50a, 50b, 50c are switchable circuit branches that switchably connect their respective endpoints. In other words, each of the first to third circuit branches 50a, 50b, 50c is switchable between a conducting state and a non-conducting state. To this end, the first circuit branch 50a comprises first switching means 60, the second circuit branch 50b comprises second switching means 70, and the third circuit branch 50c comprises third switching means 80. The first switching means 60 is arranged in the first circuit branch 50a between an intermediate node 12 and the first node 21 of the capacitor 20, wherein the intermediate node 12 is arranged between the terminal 11 of the voltage source 10 and the first node 21 of the capacitor 20. The second switching means 70 is arranged between the second node 22 of the capacitor 20 and ground. The third switching means 80 is arranged between the first node 21 and the second node 22 of the capacitor 20. Depending on the configuration of the electric load to be connected to the output node 30, the fourth circuit branch 50d may or may not be switchable. In the example of FIG. 1B, the fourth circuit branch 50d is indicated as switchable and illustrated to comprise fourth switching means 90 for switching the fourth circuit branch between a conducting state and a non-conducting state of the fourth circuit branch 50d. The fourth switching means 90 is arranged between the first node 21 of the capacitor 20 and the output node 30. The first to fourth switching means 60, 70, 80, 90, without being limited thereto, may be (controllable) switches or transistors.

The apparatus 1 further comprises the control means 40 for controlling switching of the switchable circuit assembly 50 between circuit configurations. In more detail, the control means 40 is adapted to control switching of the first to fourth switchable circuit branches 50a, 50b, 50c, 50d. To this end, the control means 40 may be adapted to control switching of the first to fourth switching means 60, 70, 80, 90, which are controllable switching means. Although not shown in the figure for reasons of conciseness, the control means 40 is connected to each of the switching means to be able to transmit switching commands to each of the switching means for controlling switching of the respective switching means.

The first circuit configuration of the switchable circuit assembly 50 introduced above is a circuit configuration in which the first and second circuit branches 50a, 50b are in the conducting state and the third circuit branch 50c is in the non-conducting state, i.e. in which the first and second switching means 60, 70 are closed and the third switching means 80 is open. The second circuit configuration of the switchable circuit assembly 50 is a circuit configuration in which the first and second circuit branches 50a, 50b are in the non-conducting state and the third circuit branch 50c is in the conducting state, i.e. in which the first and second switching means 60, 70 are open and the third switching means 80 is closed. Additionally, if present, the fourth circuit branch may be in the non-conducting state in the first circuit configuration and in the conducting state in the second circuit configuration, i.e. the fourth switching means 90 may be open in the first circuit configuration and closed in the second circuit configuration.

The third circuit configuration of the switchable circuit assembly 50 introduced above is a circuit configuration in which the first circuit branch 50a is in the conducting state and the second and third circuit branches 50b, 50c are in the non-conducting state, e.g. a circuit configuration in which the first switching means 60 is closed and the second and third switching means 70, 80 are open. If present, the fourth circuit branch 50d is in the conducting state in the third circuit configuration, i.e. the fourth switching means 90 is closed in the third circuit configuration. Further, the fourth circuit configuration of the switchable circuit assembly 50 introduced above is a circuit configuration in which the first to third circuit branches 50a, 50b, 50c are in the non-conducting state and/or the fourth circuit branch 50d is in the non-conducting state, e.g. in which the first to third switching means 60, 70, 80 are open, and/or the fourth switching means 90 is open.

In the above, a switching means is said to be "open" when it substantially prevents a current from flowing through the switching means (i.e. when it is in the non-conducting state), and is said to be "closed" when it is in the conducting state.

It is understood that a corresponding method for generating a PWM signal by means of the apparatus 1 comprises a step of controlling the first and second circuit branches 50a, 50b to switch to the conducting state and controlling the third circuit branch 50c to switch to the non-conducting state in the first period, e.g. the step of controlling the first and second switching means 60, 70 to close and controlling the third switching means 80 to open, thereby switching the switchable circuit assembly 50 to the first circuit configuration. The method further comprises a step of controlling the first and second circuit branches 50a, 50b to switch to the non-conducting state and controlling the third circuit branch 50c to switch to the conducting state in the second period, e.g. the step of controlling the first and second switching means 60, 70 to open and controlling the third switching means 80 to close, thereby switching the switchable circuit assembly 50 to the second circuit configuration. The method may further comprise steps of controlling the fourth circuit branch 50d to switch to the non-conducting state in the first period and controlling the fourth circuit branch 50d to switch to the conducting state in the second period, e.g. the steps of controlling the fourth switching means 90 to open in the first period and controlling the fourth switching means 90 to close in the second period.

Yet further, the step of controlling the switchable circuit assembly 50 to switch to the third circuit configuration may relate to controlling the first circuit branch 50a to switch to the conducting state and controlling the second and third circuit branches 50b, 50c to switch to the non-conducting state, e.g. to controlling the first switching means 60 to close and controlling the second and third switching means 70, 80 to open. The step may further comprise controlling the fourth switching means 90 to open. The step of controlling the switchable circuit assembly 50 to switch to the fourth circuit configuration may relate to controlling the first to third circuit branches 50a, 50b, 50c and/or the fourth circuit branch 50d to switch to the non-conducting state, e.g. to controlling the first to third switching means 60, 70, 80 to open, and/or to controlling the fourth switching means 90 to open.

It is to be noted that the apparatus 1 described above acts as a voltage booster (charge pump) and requires a single capacitor 20 for generating a pulse height during the pulses of the PWM signal that is substantially twice as large as the available output voltage $V_0$ of the voltage source 10, i.e. a pulse height of substantially $2V_0$. Further, the pulse height of the PWM pulses may be (discretely) varied between substantially twice the output voltage $V_0$ of the voltage source and the output voltage $V_0$ of the voltage source 10, i.e. between $2V_0$ and $V_0$. Thereby, the pulse shape of the PWM signal may be optimized in accordance with respective applications.

The switchable circuit assembly 50 may further comprise first current limiting means (not shown) for limiting a current that flows through the switchable circuit assembly 50 in the first circuit configuration, i.e. for limiting the charging current of the capacitor 20. The first current limiting means may be arranged in the first circuit branch 50a and/or in the second circuit branch 50b. The switchable circuit assembly 50 may further comprise second current limiting means (not shown) for limiting a current that flows through the switchable circuit assembly 50 in the second circuit configuration, i.e. for limiting the current that is supplied to the output node 30. The second current limiting means may be arranged in the third circuit branch 50c and/or in the fourth circuit branch 50d. The first and second current limiting means may be current sources.

It is understood that the corresponding method for generating a PWM signal by means of the apparatus 1 may comprise controlling or limiting a charging current by which the capacitor 20 is charged during the first period. Yet further, the method may comprise controlling or limiting a current that is supplied to the output node 30 during the second period.

Next, possible PWM signals output by the apparatus 1 will be described with reference to FIG. 2 and FIG. 3.

Figure 2:
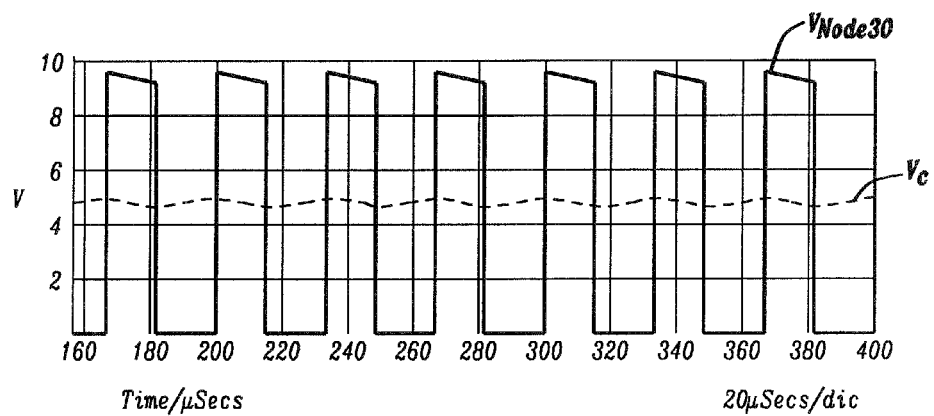
FIG. 2 schematically illustrates an example of a PWM signal output by the apparatus.

FIG. 2 schematically illustrates an example of a PWM signal output by the apparatus, wherein it is assumed without intended limitation that an electric load is applied to the output node 30 and that the output voltage $V_0$ of the voltage source 10 is about 5V. The dashed line indicates the voltage across the capacitor 20, and the solid line indicates the voltage at the output node 30. During the respective first periods, the voltage at the output node 30 is substantially zero. Since the capacitor 20 is charged, the voltage across the capacitor 20 rises during the first periods. During the respective second periods, the voltage at the output node 30, which substantially corresponds to the sum of the output voltage $V_0$ of the voltage source 10 and the voltage across the capacitor 20, starts to slightly decrease from a value of substantially twice the output voltage $V_0$ of the voltage source 10. This decrease corresponds to a discharging of the capacitor 20 during the second period. The size (capacitance) of the capacitor 20 may be chosen such that the decrease of the pulse height during the second period is small compared to the absolute pulse height, so that appropriate operation of an electric device driven by the PWM signal is not affected.

As indicated above, the PWM signal illustrated in FIG. 2 is obtained by switching the switchable circuit assembly 50 to the first circuit configuration in the first period, in particular at the beginning of the first period, and to the second circuit configuration in the second period, in particular at the beginning of the second period. This may be achieved by switching the first and second circuit branches 50a, 50b to the conducting state, switching the third circuit branch 50c to the non-conducting state, and optionally switching the fourth circuit branch 50d to the non-conducting state in the first period, in particular at the beginning of the first period, e.g. by closing the first and second switching means 60, 70, opening the third switching means 80, and optionally opening the fourth switching means 90. This may be further achieved by switching the first and second circuit branches 50a, 50b to the non-conducting state, switching the third circuit branch 50c to the conducting state, and optionally switching the fourth circuit branch 50d to the conducting state in the second period, in particular at the beginning of the second period, e.g. by opening the first and second switching means 60, 70, closing the third switching means 80, and optionally closing the fourth switching means 90.

In the above and in the remainder of the present disclosure, unless indicated otherwise, the expression "in the first period" and the like are understood to be meant to relate to each first period of the PWM signal, with a corresponding statement applying also to the second period.

Figure 3:
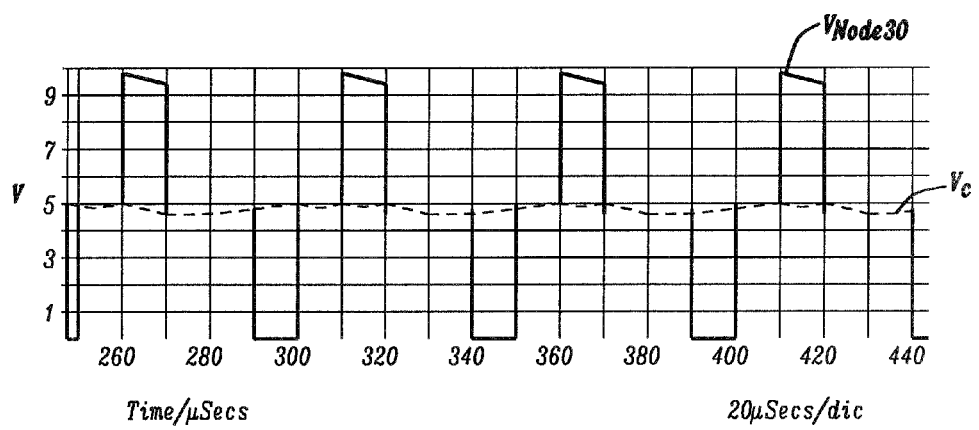
FIG. 3 schematically illustrates another example of a PWM signal output by the apparatus.

FIG. 3 schematically illustrates another example of a PWM signal output by the apparatus, wherein it is assumed without intended limitation that an electric load is applied to the output node 30, and that the output voltage $V_O$ of the voltage source 10 is about 5V. Again, the dashed line indicates the voltage across the capacitor 20, and the solid line indicates the voltage at the output node 30. During the respective first periods, the voltage at the output node 30 is substantially zero (note that the duration of the first period in relation to the second period is shorter in FIG. 3 than in FIG. 2). Since the capacitor 20 is charged, the voltage across the capacitor 20 rises during the first periods. At the beginning of the respective second periods, the voltage at the output node 30 becomes substantially equal to the output voltage $V_O$ of the voltage source 10, and after a first predetermined fraction of the second period has passed since the beginning of the second period (the first predetermined fraction is 10 μs in FIG. 3, while the overall duration of the second period is 40 μs) becomes substantially equal to the sum of the output voltage $V_O$ of the voltage source 10 and the voltage across the capacitor 20. Subsequently, the voltage at the output node 30 starts slightly decreasing from a value of substantially twice the output voltage $V_O$ of the voltage source 10. This decrease corresponds to a discharging of the capacitor 20. As indicated above, the size (capacitance) of the capacitor 20 may be chosen such that the decrease of the pulse height is small compared to the absolute pulse height, so that appropriate operation of an electric device driven by the PWM signal is not affected. After a second predetermined fraction of the second period has passed since the beginning of the second period (the second predetermined fraction is 20 μs in FIG. 3), the voltage at the output node 30 becomes substantially equal to the output voltage $V_O$ of the voltage source 10. Further, at the beginning of the subsequent first period, the voltage at the output node 30 becomes substantially zero again (the duration of the first period is 10 μs in FIG. 3). Notably, in FIG. 3 the duration of the first period is equal to the fraction of the second period for which the voltage at the output node 30 is substantially equal to twice the output voltage $V_O$ of the voltage source 10, although in general this is not necessarily the case, depending on e.g. a charging current during the first period, a load current during the second period and the capacitance of the capacitor 20.

As indicated above, the PWM signal illustrated in FIG. 3 is obtained by switching the switchable circuit assembly 50 to the first circuit configuration in the first period, in particular at the beginning of the first period, and between the second and third circuit configurations in the second period. The switching between the second and third circuit configurations is not limited to the switching operation described in connection with FIG. 3. For instance, the switchable circuit assembly 50 may be switched to the second circuit configuration at the beginning of the second period, and subsequently to the third circuit configuration. Alternatively, the switchable circuit assembly 50 may be switched to the third circuit configuration at the beginning of the second period, and subsequently to the second circuit configuration. In each of these cases, the number of switches between the second and third circuit configurations (in any direction) may be one or larger than one. In any case, the common feature of all these cases is that the switchable circuit assembly 50 is switched (on the fly) between the second circuit configuration and the third circuit configuration during the second period. It is understood that the above statement relates to both directions of switching between the second and third circuit configurations.

By switching (on the fly) of the switchable circuit assembly 50 between the second and third circuit configurations during the second period, the amount of power that is delivered to a load connected to the output node 130 can be fine-tuned and electromagnetic interference can be reduced.

In the above, switching of the switchable circuit assembly to the first circuit configuration may be achieved by switching the first and second circuit branches 50a, 50b to the conducting state and switching the third circuit branch to the non-conducting state, and optionally switching the fourth circuit branch 50d to the non-conducting state, e.g. by closing the first and second switching means 60, 70, opening the third switching means 80, and optionally opening the fourth switching means 90. Switching of the switchable circuit assembly 50 to the second circuit configuration may be achieved by switching the first and second circuit branches 50a, 50b to the non-conducting state and switching the third circuit branch to the conducting state, and optionally switching the fourth circuit branch 50d to the conducting state, e.g. by opening the first and second switching means 60, 70, closing the third switching means 80, and optionally closing the fourth switching means 90. Switching of the switchable circuit assembly 50 to the third circuit configuration may be achieved by switching the first circuit branch 50a to the conducting state and switching the second and third circuit branches 50, 50c to the non-conducting state, and optionally switching the fourth circuit branch 50d to the conducting state, e.g. by closing the first switching means 60, opening the second and third switching means 70, 80, and optionally closing the fourth switching means 90.

Figure 4:
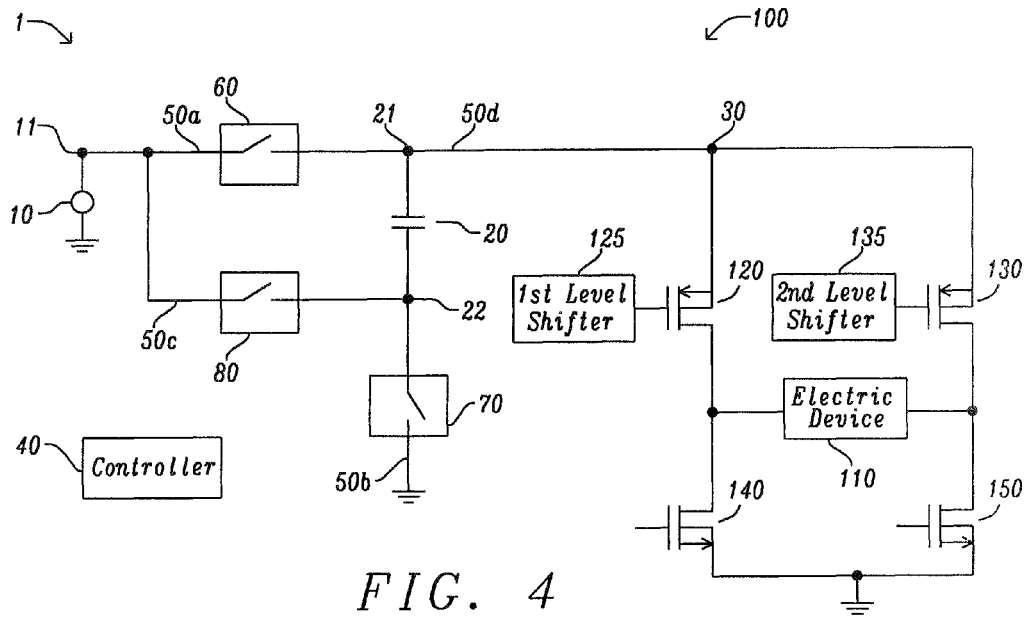
FIG. 4 schematically illustrates an example for an application of the apparatus for powering an electric device.

FIG. 4 schematically illustrates an example for an application of the apparatus 1 for powering an electric device. The apparatus 1 corresponds to the apparatus illustrated in FIGS. 1A and 1B, with the fourth switching means 90 omitted. The above explanations provided above in connection with FIGS. 1A and 1B likewise apply to the apparatus 1 illustrated in FIG. 4. The output node 30 of the apparatus 1 is connected to a bridge 100 driving an electric device 110. The bridge 100 further comprises first to fourth transistor elements 120, 130, 140, 150. The first and second transistor elements 120, 130 are controlled by first and second level shifters 125, 135, respectively, in order to control the power that is supplied to the electric device 110. Therein, the first and second transistor elements 120, 130 are controlled in phase opposition with each other. Notably, the switching capability of the bridge 100 (i.e. the switching capability of one or more of the transistor elements 120, 130, 140, 150) may be used to replace the fourth switching means 90. Typically, third transistor element 140 operates in phase with second transistor element 130, and forth transistor element 150 operates in phase with first transistor element 120. Thus, the transistor element pairs 120/150 or 130/140 replace the function of the fourth switching means 90. The bridge 100 may be replaced by a half bridge, in which case one of the terminals of the electric device 110 would be connected directly to ground. The electric device 110 may be an electric motor, for example.

Under certain circumstances, it may be necessary to discontinue power supply to the electric device 110 and to discharge any inductive elements of the electric device 110. Such a situation may be present for instance if the electromotive force of an electric motor across its terminals is to be measured. Measuring the electromotive force of an electric motor requires that the motor coil be first discharged. In order to account for such situations, the apparatus 1 may be configured as illustrated in FIG. 5.

Figure 5:
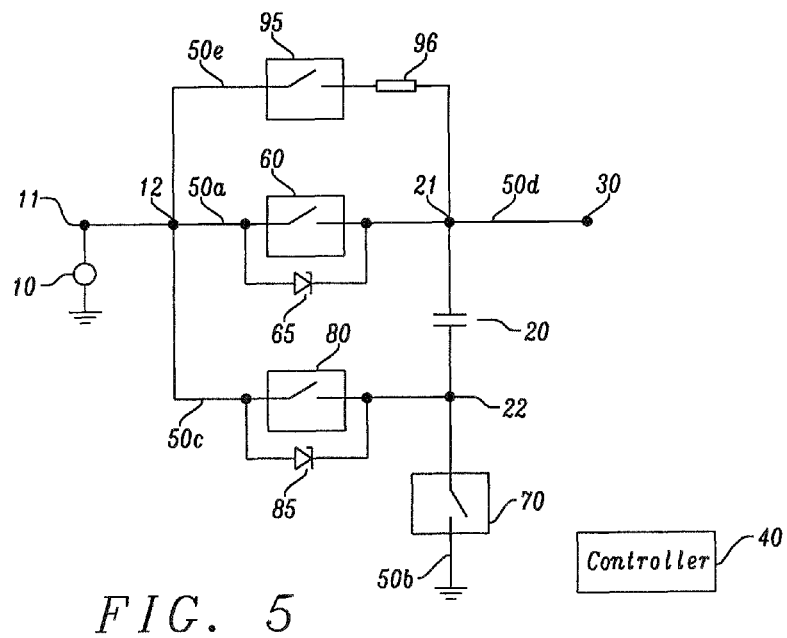
FIG. 5 schematically illustrates another example of an apparatus according to embodiments of the invention.

FIG. 5 schematically illustrates another example of an apparatus according to embodiments of the invention. The apparatus 1 in FIG. 5 corresponds to the apparatus illustrated in FIG. 1B, with the fourth switching means 90 omitted, with additional first and second Zener diodes 65, 85, and with an additional fifth circuit branch 50e. The other elements of the apparatus 1 are identical to those described above in connection with FIG. 1B.

In the above example, in which it is assumed that e.g. the bridge 100 including the electric motor 110 of FIG. 4 is connected to the output node 30 of the apparatus 1, the voltage across the electric motor 110 during the discharging process should be as large as possible in order to reduce the time for discharging the motor coil. In order to allow for a higher voltage across the electric motor 110, the first Zener diode 65 is provided in the first circuit branch 50a in parallel to the first switching means 60, and the second Zener diode 85 is provided in the third circuit branch 50c in parallel to the third switching means 80. As indicated above, the Zener diodes 65, 85 allow for a higher voltage across the electric motor 110, which reduces the time for discharging the motor coil and thus extends the time window during which a measurement of the electromotive force of the electric motor 110 can be taken.

It is further desirable to have low noise and supply coupling at the terminals of the electric motor 110 during measuring the electromotive force of the electric motor 110. Accordingly, the switchable circuit assembly 50 is further switchable to a fifth circuit configuration in which the first node 21 of the capacitor 20 is connected to the output node 30, and the second node 22 of the capacitor 20 is connected to ground. Further in the fifth circuit configuration, the output node 30 is disconnected from the voltage source 10. The control means 40 may be adapted to control the switchable circuit assembly 50 to switch to the fifth circuit configuration after power supply to the electric motor has 110 been stopped.

In the fifth circuit configuration, the second circuit branch 50b is in the conducting state, while the first and third circuit branches 50a, 50c are in the non-conducting state. If present, the fourth circuit branch 50d is in the conducting state. For instance, the second switching means 70 is closed, while the first and third switching means 60, 80 are open. If present, the fourth switching means 90 is closed.

It is understood that the corresponding method comprises the step of stopping power supply to the electric motor 110, and a step of controlling the second circuit branch 50b to switch to the non-conducting state, controlling the first and third circuit branches 50a, 50c to switch to the non-conducting state, and optionally controlling the fourth circuit branch 50d to switch to the conducting state, e.g. the step of controlling the second switching means 60 to close, controlling the first and third switching means to open, and optionally controlling the fourth switching means to close.

Switching the switchable circuit assembly 50 to the fifth circuit configuration during measurement of the electromotive force of the electric motor 110 causes the flying capacitor 20 to be connected between the top of the bridge 100 and ground. Accordingly, the bridge 100 will have low noise supply and any capacitive coupling will not pose a problem for the measurement.

As indicated above, the apparatus 1 further comprises a fifth circuit branch 50e that is switchable and connects the terminal 11 of the voltage source 10 to the first node 21 of the capacitor 20. The fifth circuit branch 50e is switchable between a conducting state and a non-conducting state of the fifth circuit branch 50e, and to this end may comprise fifth switching means 95 for switching between the conducting state and the non-conducting state of the fifth circuit branch 50e. The fifth circuit branch 50e further comprises a resistive element (resistor) 96.

In the apparatus 1 configured as described above, in the fifth circuit configuration of the switchable circuit assembly 50, the output node 30 may be further connected to the terminal 11 of the voltage source 10 through the resistor 96. In this case, the fifth circuit branch 50e is in the conducting state. This may be achieved by closing the fifth switching element 95.

It is understood that the corresponding method comprises a step of controlling the fifth circuit branch 50e to switch to the conducting state, e.g. by controlling the fifth switching element 95 to close.

Connecting the top of the bridge 100 to the terminal 11 of the voltage source 10 during the measurement of the electromotive force of the electric motor 110 allows maintaining the voltage at the top of the bridge 100 at the (filtered) supply voltage.

In another variation, the circuit assembly can be used to smooth the operation of the motor by configuring the switchable circuit assembly as an RC element. For this purpose, the second switching means 70 may be closed to connect capacitor 20 to ground. Further, the first switching means 60 and/or the fourth switching means 90 may be closed. Due to the internal resistance of the first switching means 60 and the fourth switching means 90 together with the capacitance of capacitor 20, an RC element develops, which can smooth the motor circuit. Alternatively, the fifth switching element 95 and resistive element (resistor) 96 in FIG. 5 may be used, or transistor(s) in the first switching means 60 and/or the fourth switching means 90 may be operated in a way where they have an increased resistance. In another variation, a voltage controller may be included to generate the RC element It should be noted that the description and drawings merely illustrate the principles of the proposed methods and apparatus. Those skilled in the art will be able to implement various arrangements that, although not explicitly described or shown herein, embody the principles of the invention and are included within its spirit and scope. Furthermore, all examples and embodiment outlined in the present document are principally intended expressly to be only for explanatory purposes to help the reader in understanding the principles of the proposed methods and apparatus. Furthermore, all statements herein providing principles, aspects, and embodiments of the invention, as well as specific examples thereof, are intended to encompass equivalents thereof.

What is claimed is:

1. An apparatus for generating a pulse width modulated, PWM, signal with a first period of time and a second period of time, wherein said PWM signal has a PWM pulse during the second period and does not have the PWM pulse during the first period, the apparatus comprising:
   a voltage source;
   a capacitor;
   an output node for outputting the PWM signal, to drive an electric motor;
   a switchable circuit assembly for connecting the voltage source, the capacitor and the output node; and
   control means for controlling switching of the switchable circuit assembly, wherein the switchable circuit assembly is adapted to be switchable between a first circuit configuration in which the capacitor is connected in parallel to the voltage source so as to be chargeable by the voltage source, and a second circuit configuration in which the capacitor is connected in series between the voltage source and the output node such that polarities of the voltage source and the capacitor are aligned with each other; and wherein the control means is adapted to control the switchable circuit assembly to switch to the first circuit configuration in the first period, and to switch to the second circuit configuration in the second period.

2. The apparatus according to claim 1, wherein the switchable circuit assembly comprises:

a first circuit branch having first switching means and connecting a terminal of the voltage source to a first node of the capacitor;

a second circuit branch having second switching means and connecting the second node of the capacitor to ground; and a third circuit branch having third switching means and connecting the second node of the capacitor to the terminal of the voltage source;

wherein the first circuit configuration is a circuit configuration in which the first and second switching means are closed and the third switching means is open; and wherein the second circuit configuration is a circuit configuration in which the first and second switching means are open and the third switching means is closed.

3. The apparatus according to claim 1, further comprising current limiting means for limiting the current by which the capacitor is charged when the switchable circuit assembly is switched to the first circuit configuration.

4. The apparatus according to claim 2, wherein the switchable circuit assembly further comprises a fourth circuit branch connecting the first node of the capacitor to the output node.

5. The apparatus according to claim 4, wherein the fourth circuit branch comprises fourth switching means; and wherein the fourth switching means is open in the first circuit configuration and closed in the second circuit configuration.

6. The apparatus according to claim 1, wherein the switchable circuit assembly is further switchable to a third circuit configuration in which the output node is connected to the terminal of the voltage source such that the voltage output by the voltage source is applied to the output node; and wherein the control means is adapted to control the switchable circuit assembly to switch between the second circuit configuration and the third circuit configuration during the second period.

7. The apparatus according to claim 1, wherein the switchable circuit assembly is further switchable to a third circuit configuration in which the output node is connected to the terminal of the voltage source such that the voltage output by the voltage source is applied to the output node, and to a fourth circuit configuration in which the output node is not connected to the terminal of the voltage source; and wherein the control means is adapted to operate in a first operating mode in which the control means controls the switchable circuit assembly to switch between the first circuit configuration in the first period and the second circuit configuration in the second period, and in a second operating mode in which the control means controls the switchable circuit assembly to switch between the fourth circuit configuration in the first period and the third circuit configuration in the second period.

8. The apparatus according to claim 2, wherein the first circuit branch further comprises a first Zener diode connected in parallel to the first switching means; and wherein the third circuit branch further comprises a second Zener diode connected in parallel to the third switching means.

9. The apparatus according to claim 1, being adapted to supply power to an electric motor via the output node, possibly via a bridge circuit or a half bridge circuit.

10. The apparatus according to claim 9, wherein the switchable circuit assembly is further adapted to be switchable to a fifth circuit configuration in which the first node of the capacitor is connected to the output node, and the second node of the capacitor is connected to ground; and wherein the control means is adapted to control the switchable circuit assembly to switch to the fifth circuit configuration after power supply to the motor has been stopped.

11. The apparatus according to claim 10, wherein in the fifth circuit configuration the output node is further connected to the terminal of the voltage source through a resistance.

12. The apparatus according to claim 9, wherein the fourth switching means are implemented by switching means of the bridge circuit or the half bridge circuit.

13. A method of generating a pulse width modulated, PWM, signal with a first period of time and a second period of time, wherein said PWM signal has a PWM pulse during the second period and does not have the PWM pulse during the first period, by means of an apparatus comprising: a voltage source, a capacitor, an output node for outputting the PWM signal, and a switchable circuit assembly for connecting the voltage source, the capacitor and the output node, wherein the switchable circuit assembly is adapted to be switchable between a first circuit configuration in which the capacitor is connected in parallel to the voltage source so as to be chargeable by the voltage source, and a second circuit configuration in which the capacitor is connected in series between the voltage source and the output node such that polarities of the voltage source and the capacitor are aligned with each other, the method comprising the steps of:

switching the switchable circuit assembly to the first circuit configuration during the first period; and switching the switchable circuit assembly to the second circuit configuration during the second period.

14. The method according to claim 13, wherein the switchable circuit assembly comprises a first circuit branch having first switching means and connecting a terminal of the voltage source to a first node of the capacitor, a second circuit branch having second switching means and connecting the second node of the capacitor to ground, and a third circuit branch having third switching means and connecting the second node of the capacitor to the terminal of the voltage source; and wherein the method comprises the steps of:

closing the first and second switching means and opening the third switching means during the first period, thereby switching the switchable circuit assembly to the first circuit configuration; and opening the first and second switching means and closing the third switching means during the second period, thereby switching the switchable circuit assembly to the second circuit configuration.

15. The method according to claim 13, further comprising limiting the current by which the capacitor is charged when the switchable circuit assembly is switched to the first circuit configuration.

16. The method according to claim 13,
wherein the switchable circuit assembly further comprises a fourth circuit branch having fourth switching means for connecting the first node of the capacitor to the output node; and
wherein the method further comprises the steps of:
opening the fourth switching means during the first period of time; and
closing the fourth switching means during the second period of time.

17. The method according to claim 13,
wherein the switchable circuit assembly is further switchable to a third circuit configuration in which the output node is connected to the terminal of the voltage source such that the voltage output by the voltage source is applied to the output node; and
wherein the method further comprises:
switching the switchable circuit assembly between the second circuit configuration and the third circuit configuration during the second period.

18. The method according to claim 13,
wherein the switchable circuit assembly is further switchable to a third circuit configuration in which the output node is connected to the terminal of the voltage source such that the voltage output by the voltage source is applied to the output node, and to a fourth circuit configuration in which the output node is not connected to the terminal of the voltage source; and
wherein the method further comprises:
switching the switchable circuit assembly to the fourth circuit configuration in the first period; and
switching the switchable circuit assembly to the third circuit configuration in the second period.

19. The method according to any one of claim 13, further comprising:
supplying the generated PWM signal to a motor connected to the output node, possibly via a bridge circuit or a half bridge circuit.

20. The method according to claim 19,
wherein the switchable circuit assembly is further adapted to be switchable to a fifth circuit configuration in which the first node of the capacitor is connected to the output node and the second node of the capacitor is connected to ground; and
wherein the method further comprises:
stopping power supply to the motor; and
switching the switchable circuit assembly to the fifth circuit configuration after power supply to the motor has been stopped.

21. The method according to claim 20, wherein in the fifth circuit configuration the output node is further connected to the terminal of the voltage source through a resistance.

22. The method according to claim 14,
wherein the first circuit branch further comprises a first Zener diode connected in parallel to the first switching means; and
wherein the third circuit branch further comprises a second Zener diode connected in parallel to the third switching means.

23. The apparatus according to claim 19,
wherein the fourth switching means are implemented by switching means of the bridge circuit or the half bridge circuit.

* * * * *